United States Patent [19]

Sharman

[11] Patent Number: 5,260,888
[45] Date of Patent: Nov. 9, 1993

[54] SHIFT AND ADD DIGITAL SIGNAL PROCESSOR

[75] Inventor: Richard A. Sharman, Dunstable, England

[73] Assignee: Eastman Kodak Company, Rochester, N.Y.

[21] Appl. No.: 889,578

[22] Filed: May 28, 1992

[51] Int. Cl.[5] .................................. G06F 15/31
[52] U.S. Cl. ................................. 364/724.05
[58] Field of Search ............... 364/724.05, 724.01, 364/715.01

[56] References Cited

U.S. PATENT DOCUMENTS

| | | | |
|---|---|---|---|
| 3,919,535 | 11/1975 | Vattuone | 235/164 |
| 4,185,325 | 1/1980 | Appel | 365/244 |
| 4,255,794 | 3/1981 | Nakayama | 364/724 |
| 4,430,721 | 2/1984 | Acampora | 364/724 |
| 4,507,676 | 3/1985 | Dischert et al. | 358/30 |
| 4,524,423 | 6/1985 | Acampora | 364/724 |
| 4,615,026 | 9/1986 | Schiff | 364/724 |
| 4,691,293 | 9/1987 | Conboy | 364/724 |
| 4,703,447 | 10/1987 | Lake, Jr. | 364/724 |
| 4,706,113 | 11/1987 | Ito et al. | 358/37 |
| 4,862,403 | 8/1989 | Iwase et al. | 364/724.05 |
| 4,958,311 | 9/1990 | Kadowaki et al. | 364/724.01 |
| 5,144,572 | 9/1992 | Awata et al. | 364/724.05 |

Primary Examiner—Long T. Nguyen
Attorney, Agent, or Firm—David M. Woods

[57] ABSTRACT

A shift and add digital image processor (1) includes two sections (3) and (5), each including a latch (10, 22) for latching an input signal, an adder (18, 28) for summing two channels output from the latch with programmable delay (14, 26) therebetween, and a bit-shifting scaler (20, 30) for generating "powers of two" functions from the output of the adder. By selecting the input to the second section (5) either from the output of the first latch (10) or from image pixels delayed by at least one line with respect to the pixels input to the first section (3), the processor may be set up to perform either one- or two-dimensional filter functions.

16 Claims, 6 Drawing Sheets

```
                    PIXEL
         | 0 |-1 |-2 |-3  -4  -5  -6  -7  -8
LINE(0)  | X | X | X |
```

FIG. 3A

```
                    PIXEL
         | 0 |-1 |-2 |-3  -4  -5  -6  -7  -8
LINE(0)  | X |   |   |
LINE(1)  | X |   |   |
```

FIG. 3B

```
                    PIXEL
         | 0 |-1 |-2 |-3  -4  -5  -6  -7  -8
LINE(0)  | X |   | X |
LINE(1)  | X |   | X |
```

SHIFT AND ADD DIGITAL SIGNAL PROCESSOR

FIELD OF INVENTION

The invention generally relates to signal processing of digital data and, in particular, to the use of arithmetic shift and add circuits in the digital processing of image data.

BACKGROUND OF THE INVENTION

U.S. Pat. No. 4,430,721, which was issued Feb. 7, 1984 in the name of Acampora, describes a linear phase digital filter processor in which digital data is delayed in a shift register, then symmetrically tapped around a center tap, and added in pairs from the outside taps inward to build up "powers of two" filter functions. Each tap is weighted by bit-shifting the delayed data before it is added. U.S. Pat. No. 4,524,423, which was issued Jun. 18, 1985 also in the name of Acampora, shows a similar filter configuration where, because the filter coefficient values are symmetrical around the center tap, the data from symmetrical taps are first added and then the sum is bit-shifted to achieve "powers of two" functions. U.S. Pat. No. 4,615,026, which was issued Sep. 30, 1986 in the name of Schiff, shows a shift and add weighting circuit for a digital filter in which the arithmetic bit-shifting circuits are responsive to control signals that determine the magnitude of each shift.

The Acampora and Schiff references teach specific architectures for a one-dimensional digital filter. There is a need, particularly in ASIC (Application Specific Integrated Circuit) implementations, for a flexible processor architecture that can accommodate different types of filter functions in both one and two dimensions.

SUMMARY OF THE INVENTION

Because symmetrical filters, as described by the Acampora references, generate symmetrical coefficients that are summed as individual pairs, and then working inward from the outside edges of the filter, the sums of the symmetrically paired coefficients are added in turn finally reaching the center, substantial flexibility may be obtained by laying out the symmetrical operations in a cascaded architecture and then optionally allowing an external input between each cascaded section. By selecting, at this point, between the continuous cascading of a one-dimensional summation and the interjection of an external input having one or more line delays, the filter architecture can be adapted for either a one-dimensional or a two-dimensional filter implementation.

An object of the invention therefore is to provide a shift and add digital filter architecture that is easily convertible for either one- or two-dimensional filter functions.

In accordance with the invention, the basic elements of a digital signal processor are provided in two sections for implementing an arithmetic process upon a clocked series of digitized signals arranged in either one or two dimensions. The first section includes first input means providing at least a one-clock delay to a first series of digital signals, a first adder, means for applying the signals from the first input means to each input of the first adder and for delaying at least one of the signals input to the first adder by at least a one-clock delay, and first arithmetic means for applying an arithmetic operation to the signals processed by the first adder. The second section includes a similarly-configured second input means, a second adder, means for applying the signals from the second input means to each input of the second adder and for delaying at least one of the signals input to the second adder by a one-clock delay, and second arithmetic means for applying an arithmetic operation to the signals processed by the second adder. The objective of flexibility is obtained by selecting the input of the second input means from either the output of the first input means or from a further series of digital signals delayed with respect to signals input to the first section. The output of the first and second adders is then combined to form either a one-dimensional or a two-dimension processing function dependent upon the input selection made to the second input means.

The basic elements of the digital processor may then be cascaded with one or more like processors to form larger one- or two-dimensional processing functions.

BRIEF DESCRIPTION OF THE DRAWINGS

The invention will described in relation to the drawings, wherein.

DESCRIPTION OF THE PREFERRED EMBODIMENTS

Figure 1:
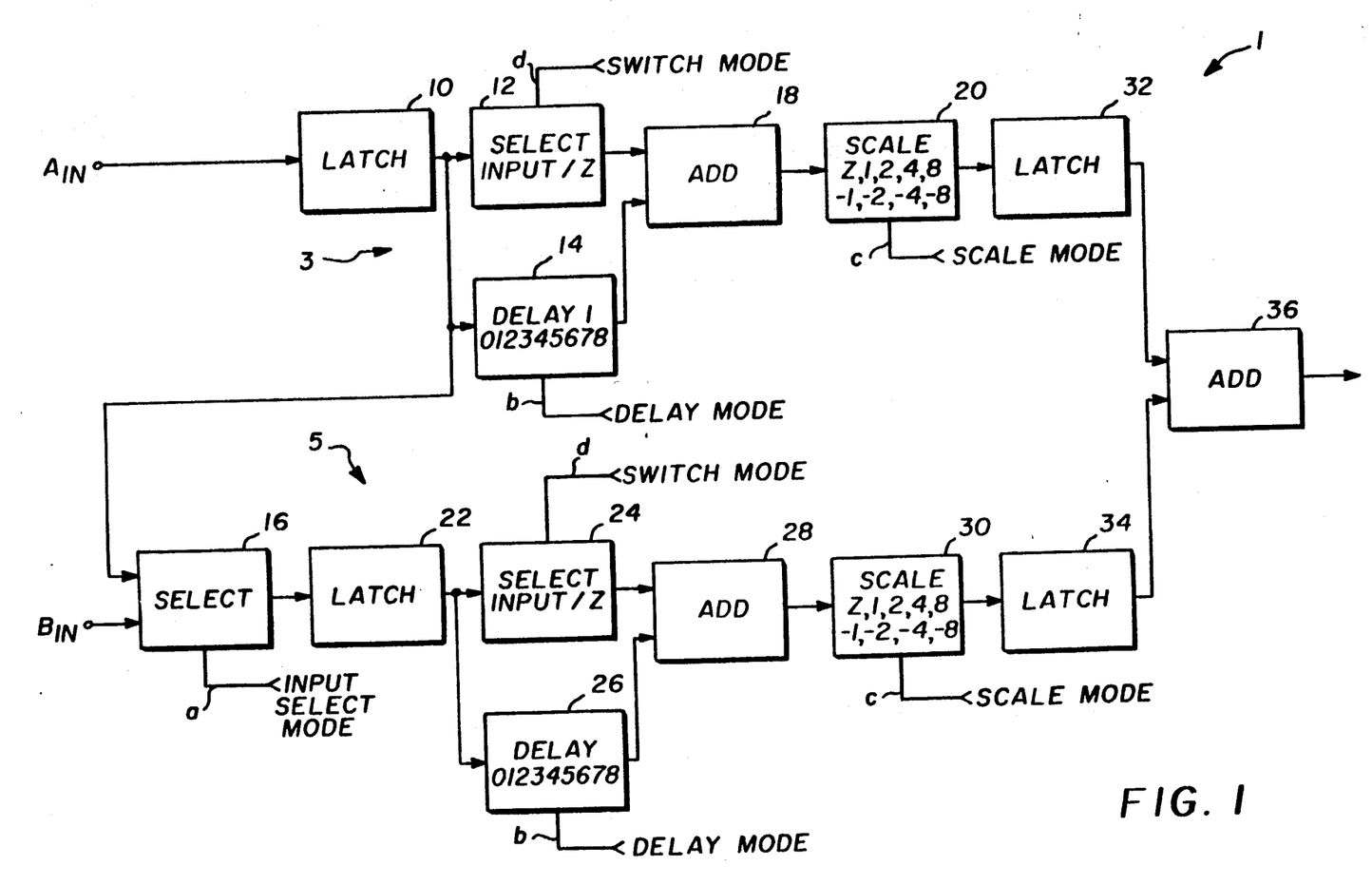
FIG. 1 is a block diagram of the basic elements of a shift and add digital processor in accordance with the invention.
Figure 2A:
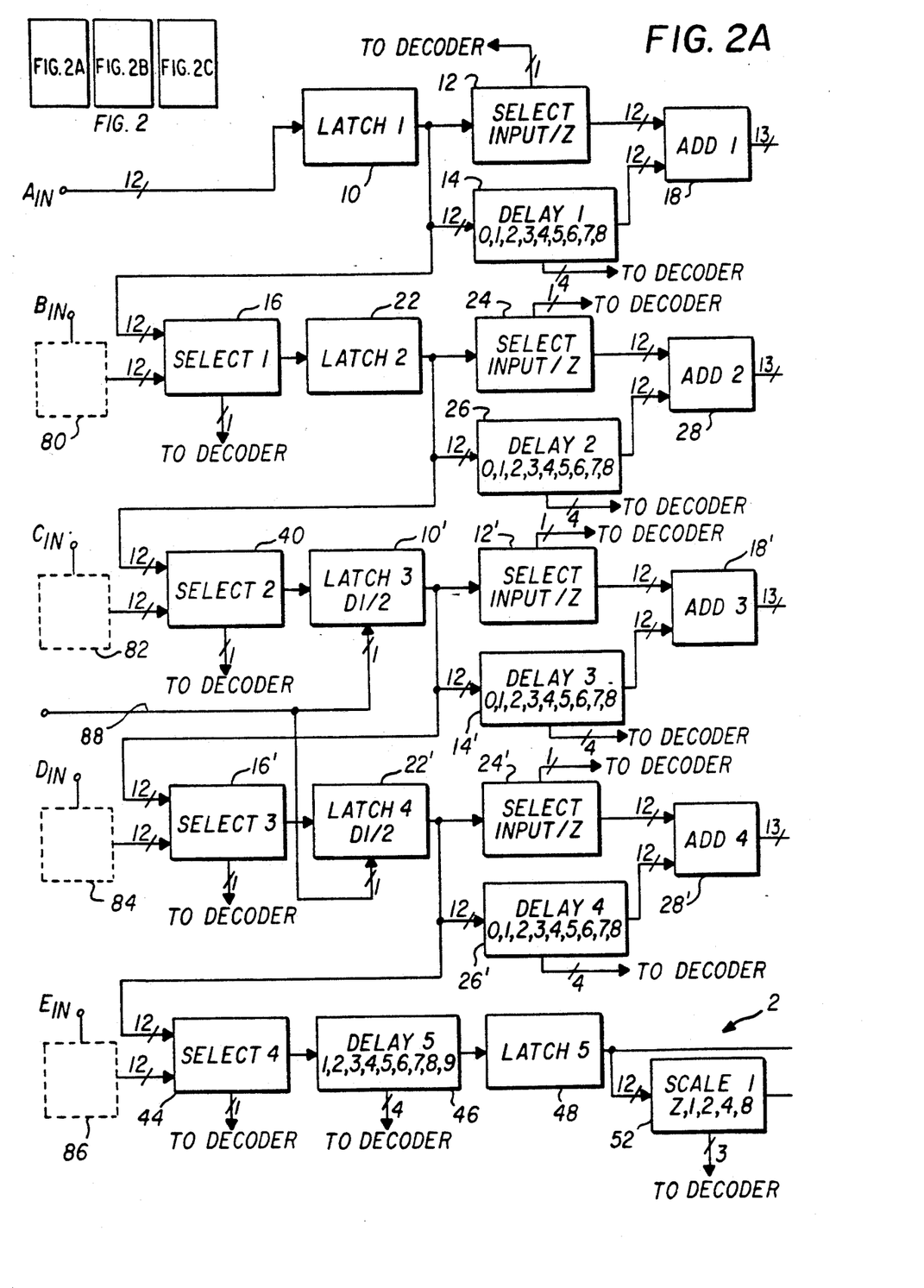
FIG. 2 is a block diagram, divided into FIGS. 2A, 2B, and 2C, of a larger matrix digital processor, employing a plurality of the processors illustrated in FIG. 1.
Figure 2B:
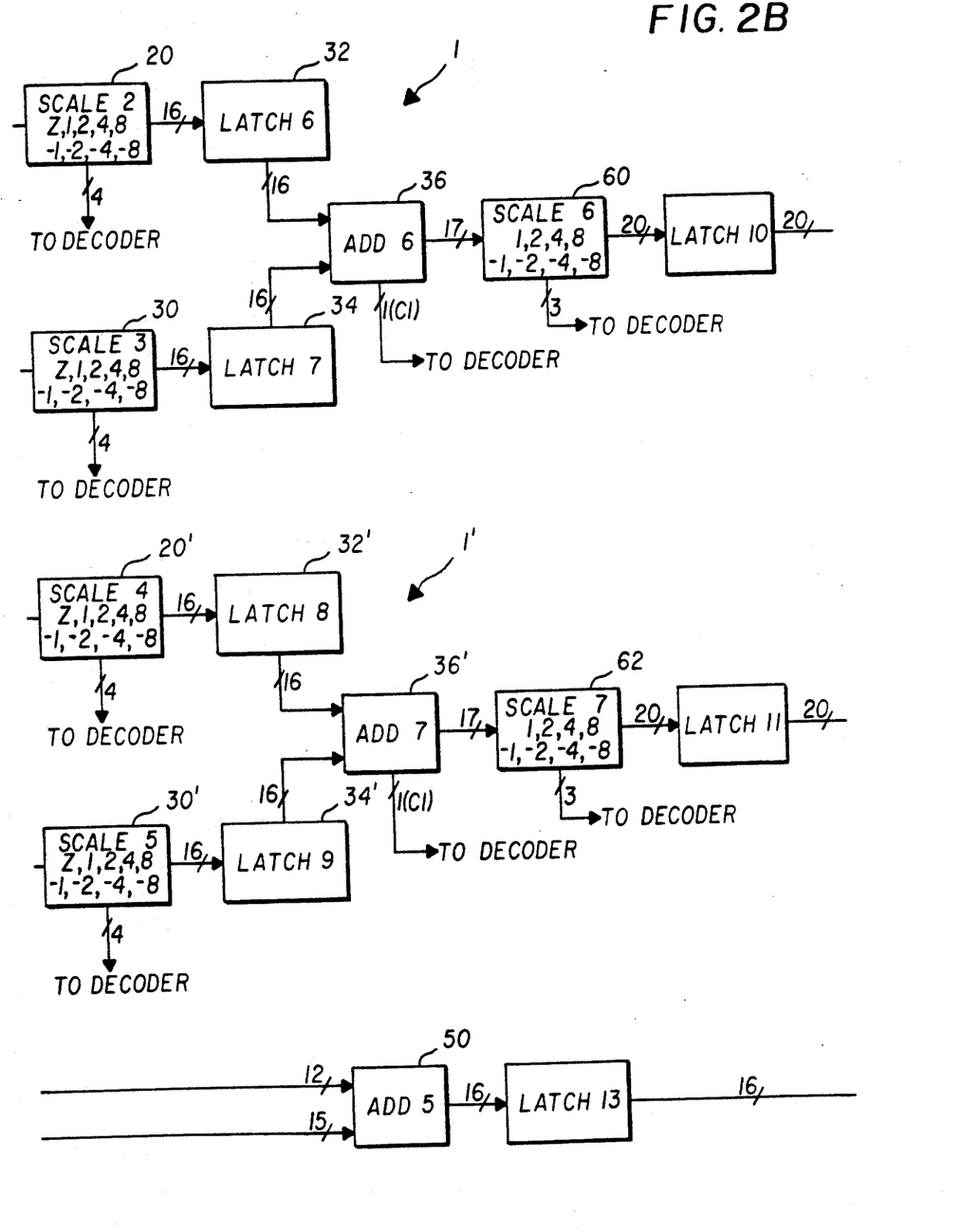
Figure 2C:
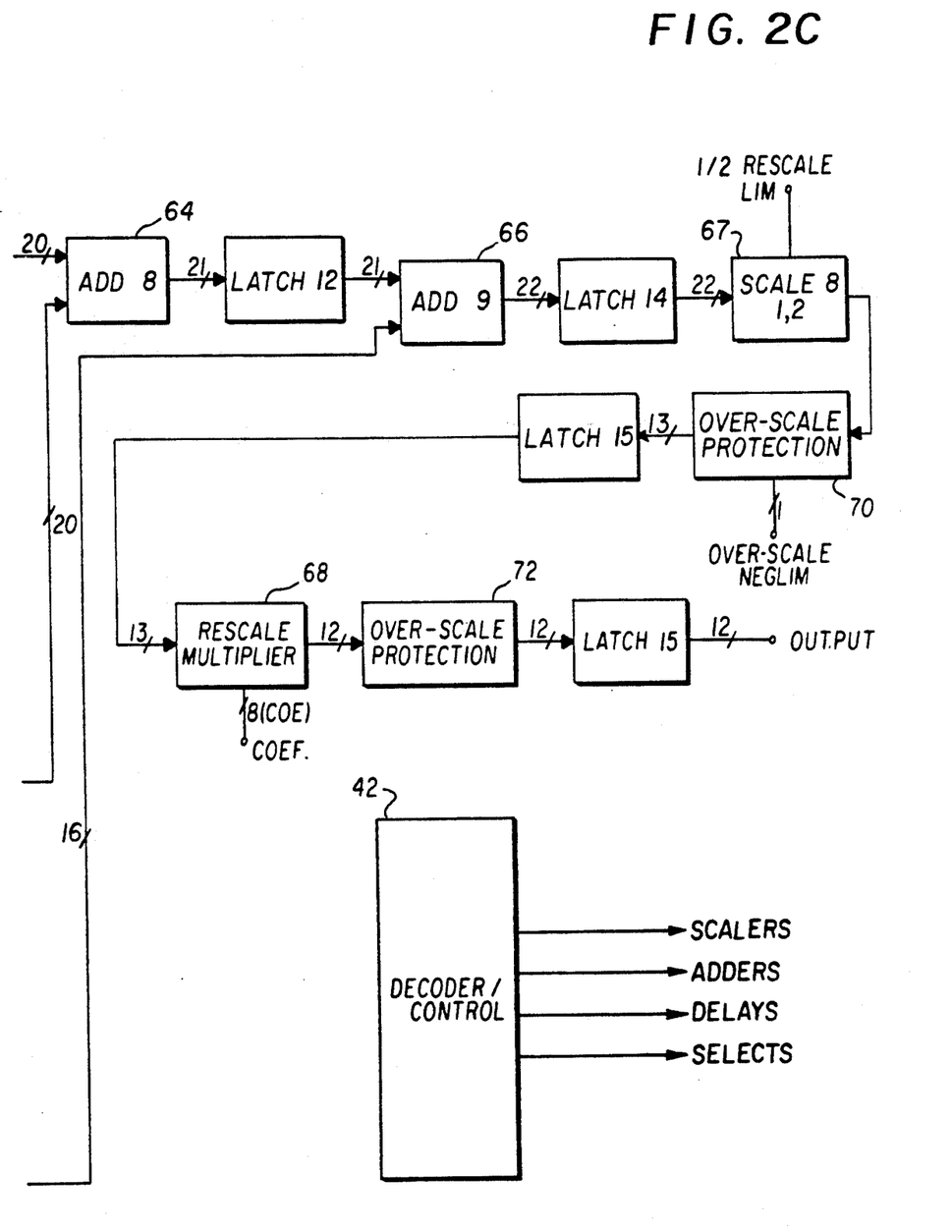

The invention relates to a signal processor in which digital image data is delayed, shifted in significance, and added (or delayed, added, and shifted in sequence) to build up "powers of two" filter functions. FIG. 1 shows a diagram of the basic elements of a unit processor 1 according to the invention. FIGS. 2A, 2B, and 2C (which hereinafter will simply be referred to as FIG. 2) show a cascading of two of the unit processors (1 and 1') of FIG. 1, together with a third processor channel 2, to implement a larger filter matrix. Similar elements in the two figures are assigned the same reference characters, with primes (') used in FIG. 2 to distinguish the processing elements of the additional unit processor. Referring to both FIGS. 1 and 2, mode lines are used to select an input configuration of pixels, the number of pixels of delay, the data bit shift, and an output rescale coefficient. In particular, the input select mode line a and the delay mode lines b program the processor to one of three basic filter configurations:

(1) a horizontal filter using a single input and a plurality of pixel delays;

(2) a vertical filter using an appropriate number of inputs and at least one line delay; and (3) an "X" type filter using a combination of line delays and pixel delays.

The shifts input on the scale mode lines c determine the coefficients, and therefore the nature of the filter, i.e., high pass, low pass, band pass, etc.

The processing unit 1 of FIG. 1 comprises two processing sections 3 and 5. In processing section 3, a time series of digital signals are input through line $A_{IN}$ to a latch 10, which is clocked (clock not shown) to provide at least a one-clock delay and to set the timing of the input data to a known reference point. The output of the latch 10 is routed to a channel selector 12, a delay 14, and an input selector 16. The delay 14 may be programmed by the delay mode line b to a variable number of clocks of delay corresponding to discrete pixel delays of between 0 and 8 elements. The channel selector 12 may be programmed by a switch mode line d to set all zeros at its output or to connect its input straight through to its output without change. The outputs of the channel selector 12 and the delay 14 are applied to the two inputs of an adder 18 and the output of the adder 18 is then bit-shifted in a scaler 20. The scaler 20 applies a conventional bit-shifting arithmetic operation, in which the number of bits of right shift are set by the scale mode line ("Z" being a zero output condition). Bits of right-shift correspond to "powers of two" division for positive filter coefficients and bits of right shift followed by complementing correspond to "powers of two" division for negative filter coefficients (i.e, shifts of 0, 1, 2, or 3 provide division by 1, 2, 4, or 8, or, with complementing, division by $-1$, $-2$, $-4$, or $-8$).

The input selector 16 is programmed by the input select mode line a to select either data from the latch 10 or data input through the line $B_{IN}$. In practice of the invention, data from the latch 10 is a continuation of the same dimension data, while data input through the line $B_{IN}$ is delayed sufficiently with respect to the signals input to the latch 10 as to represent a second dimension of data. If the input selector 16 is programmed to route the data from the latch 10 through to a latch 22 in the processing section 5, then it can be seen that the data at the output of the latch 22 is one clock period (or, for image data, one pixel) later than the data at the output of the latch 10. In a configuration generally similar to the processing section 3, the output of the latch 22 in processing section 5 is routed through channel selector 24 and a delay 26 to an adder 28. The adder output is then scaled by a scaler 30. The amount of delay for one input to the adder 28, between 0 and 8 pixel elements, is programmed by the delay mode line b to the delay 26. The other input to the adder 28 is programmed by the switch mode line d to the channel selector 24 to be either all zeros or to be the input to the selector 24. The value of the arithmetic operation performed upon the output of the adder 28 is controlled by the shift input on the scale mode line c to the scaler 30. Depending upon the scale mode, the scaler either shifts up to three bits (or no shift), or has a zero (Z) output. The respective outputs of the scalers 20 and 30 are applied to respective latches 32 and 34 to restore the data timing. An adder 36 then combines the scaled values from the sections 3 and 5 into a single output sum signal.

Figure 3A:
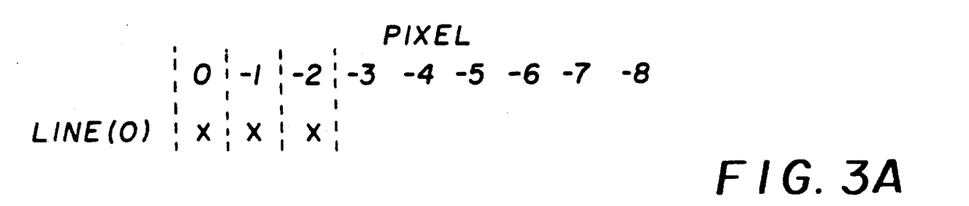
FIGS. 3A, 3B, and 3C are examples of the pixel coverage of the filter processor of FIG. 1.

In one example of operation upon three pixels as illustrated in FIG. 3A (selected pixels are symbolized by "x"), the delay 14 is set to two pixels and the channel selector 12 is set to pass its input through without change. The output of the adder 18 then will be the sum of pixel (0) and pixel ($-2$). If the input selector 16 is set to select data from the latch 10, the channel selector 24 is set to zero output, and the delay 26 is set to zero delay, then the output of the adder 28 will be pixel ($-1$). This is due to the one pixel delay in the latch 22. The outputs of the adders 18 and 28 are then scaled by scalers 20 and 30 and latched in latches 32 and 34 to restore the data timing. The scalers 20 and 30 can be set to the zero output condition (Z), or to divide by 1, 2, 4, or 8 by right bit shifting, or to divide by $-1$, $-2$, $-4$, or $-8$ by right bit shifting and complementing for negative filter coefficients. More specifically, if the scaler 20 is set to "2" then its output will be the addition of pixel (0) and pixel ($-2$) divided by two. If scaler 30 is set to "1", then its output will be pixel ($-1$) with no scaling. These scale settings provide (from the adder 36) a low pass output having a weighting function of 0.5, 1.0, 0.5 upon any set of three pixels, that is, the sum of pixel (0) and pixel ($-2$) divided by two plus pixel ($-1$). If the scale factor of the scaler 20 were set to $-2$, then adder 36 would provide a high pass output having a weighting function of $-0.5$, 1.0, $-0.5$, and so on.

Figure 3B:
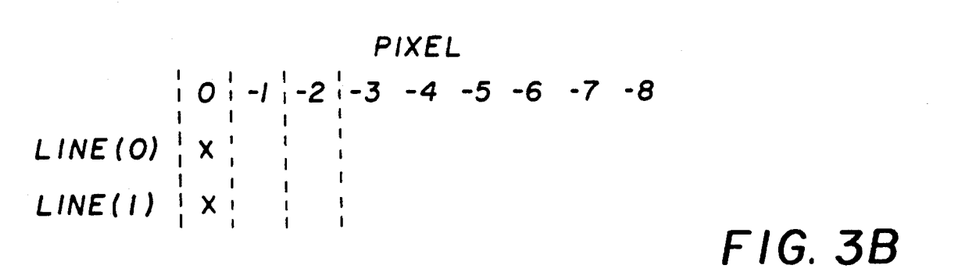
Figure 3C:
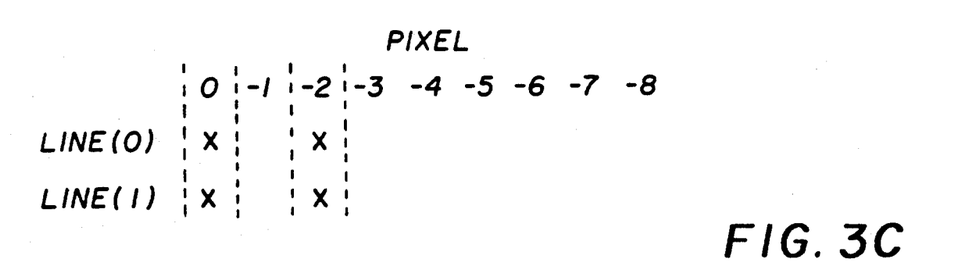

One feature of the invention is the flexibility provided by enabling the selector 16 to select either the output of the latch 10 or the input on the line $B_{IN}$. If the input selector 16 is set to select the input $B_{IN}$ and the data at $B_{IN}$ is one video line later than that at $A_{IN}$, a vertical average of the image data will be obtained. (The line delay will ordinarily be obtained by a one-line delay element, not shown, arranged to preceed the $B_{IN}$ input to the input selector 16; a conventional delay line or a memory-based line delay may be used.) More specifically, if the delays 14 and 26 are set to zero delay, the channel selectors 12 and 24 are set to provide zero output, and the scalers 20 and 30 are set to divide by two, a purely vertical average of the two pixels shown in FIG. 3B will be obtained. If the delays 14 and 26 are set to a two pixel delay and the channel selectors 12 and 24 are set to pass their input straight through, then the output of the adder 36 will be a four-pixel area average of pixels (0) and ($-2$) from line (0) and pixels (0) and ($-2$) from line (1) (as shown in FIG. 3C).

FIG. 2 shows a cascaded arrangement of unit processors 1 and 1', together with an additional processor 2 for carrying out one of several filter implementations, including:

(1) a horizontal filter of up to nine pixels using internal pixel delays;

(2) a vertical filter of up to five pixels using external line delays; and (3) an "X" type filter of up to a 5×5 pixel area using a combination of external line delays and internal pixel delays.

The basic functions of the elements of the unit processor 1 are duplicated in the functions of section 1', with the addition of an input selector 40 for selecting either the output of the latch 22 in processor 1 or the input on the line $C_{IN}$ (input selector 16' likewise can optionally select the input on line $D_{IN}$). The mode control lines of FIG. 1 are shown in FIG. 2 as lines that are connected to a decoder 42, which provides the programmable inputs to the specific functional elements. Although not specifically shown, the decoder 42 receives external input dictating the setup of the filter, i.e., the dimensions, delays and coefficients. The additional processor 2 includes an input selector 44 that is programmed to select either the output from the latch 22' or the input on the line $E_{IN}$. A variable pixel delay is provided to the latched output by the delay 46, and the thus-delayed data is latched by latch 48. The output of the latch 48 is applied directly by one pathway to the adder 50 and by another pathway through a scaler 52, which applies a positive right shift of 0 to 3 bits (or a zero output) to the data before it is sent to the adder 50.

The output from the processors 1 and 1' are adjusted in respective scalers 60 and 62, added together in an adder 64, and thereafter added to the output of section 2 in an adder 66. The scalers 60 and 62 may be programmed as hereinbefore described by bit-shifting to obtain "powers of two" functions. The output of the overall filter matrix is rescaled in a rescale multiplier 68 to normalize the complete filter function. Overscale protection is provided before and after rescaling by overscale elements 70 and 72.

Output protection can be set to either provide a unipolar output, between zero and the maximum positive value, or a bi-polar output with values between the same maximum positive value and an equal maximum negative value. The rescale multiplier 68 in conjunction with a scaler 67 and the overscale protection elements 70 and 72 can ensure that when the whole processor is adding a number of data channels that the least significant bits (LSBs) can track through. This means that an LSB change at any input produces an LSB change at the output. This is an important consideration when adding a detail or high pass signal to a base-band signal, as in a video enhancement process.

Figure 4A:
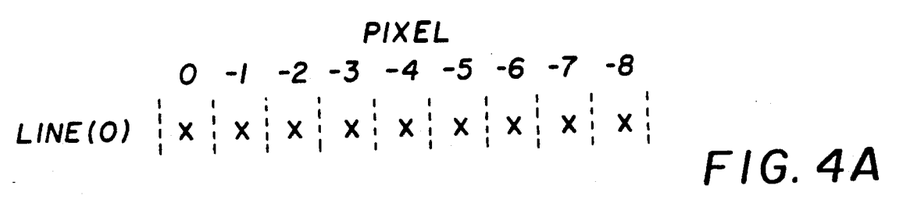
FIGS. 4A, 4B, and 4C are examples of the pixel coverage of the filter processor of FIGS. 2A, 2B, and 2C.

In operation, the cascaded filter processor of FIG. 2 may be configured to carry out various functions, including, for example, a nine-pixel average along a line, or a 5×5 "X" type matrix average over a block of pixels. When configured for a nine-point average of a pixel matrix as shown in FIG. 4A, the input selectors 16, 40, 16', and 44 are set to select the internal cascaded data stream, that is, the output of the latches 10, 22, 10' and 22', respectively. In this way, with a single pixel delay (provided by the latches 22, 10', and 22') between the outputs of the selectors 16, 40, 16', and 44, the first half of a filter function can be built up, and the delayed data through the delays 14, 26, 14', and 26' build up the second half of the filter function. More specifically, each channel selector 12, 24, 12', and 24' is set to pass through the data on its input without change. If delay 14 is set to eight pixels, then the output of adder 18 will be the sum of pixels (0) and (−8). Likewise, if the delays 26, 14', and 26' are respectively set to six, four, and two pixels, then the outputs of adders 28, 18' and 28' will be the sum of pixels (−1) and (−7), (−2) and (−6), and (−3) and (−5), respectively. Due to the combined delay effect of the latches 22, 10', 22', and 48 (delay set to zero delay), pixel (−4) appears at the output of adder 50. Ignoring any further common latch delays, the weighted sum of pixels (0) to (−8) will appear at the output of adder 66. The desired filter coefficients (weightings) can be set by adjustment of the scalers 20, 30, 20', 30', and 52: scaler 20 sets the coefficient of pixels (0) and (−8), scaler 30 sets the coefficients of pixels (−1) and (−7), scaler 20' sets the coefficients of pixels (−2) and (−6), scaler 30' sets the coefficients of pixels (−3) and (−5), and scaler 52 sets the coefficient of center pixel (−4). The coefficient of the center pixel(−4) can be adjusted by setting scaler 52 to add a proportion of the output from the latch 48 to itself in the adder 50. Thus by varying the setting of the scaler 52 from Z, the zero output condition, to divide by 1, 2, 4, or 8 will give coefficient values for the center pixel of 1, 2, 1.5, 1.25, and 1.125. The scaler 60 provides further "powers of two" division for the sum of pixels 0, −1, −7, and −8, and scaler 62 provides further division for the sum of pixels −2, −3, −5, and −6. The one dimensional filter function is thus applied across the array of pixels shown in FIG. 4A.

In use, these scale adjustments provide for a wide range of filter coefficients, although this architecture is of particular use with horizontally symmetrical filter functions. For example, the settings of the scale factors to obtain an approximate nine point Gaussian filter function using powers of 1/64, 1/16, ½, 1, 1¼, 1, ½, 1/16, 1/64 would include a) a scale factor of 8 for the scaler 52 to obtain the center coefficient of 1¼;

b) scale factors of 1 for the scalers 30' and 62 to obtain the coefficient of 1 either side of center;

c) a scale factor of 2 for the scaler 20' to obtain the next outward coefficients of ½;

d) scale factors of 2 and 8 for scalers 30 and 60, respectively, to obtain the next outward coefficients of 1/16; and e) a scale factor of 8 for scaler 20 to obtain the outermost coefficient of 1/64 (at the input to the adder 64).

Figure 4B:
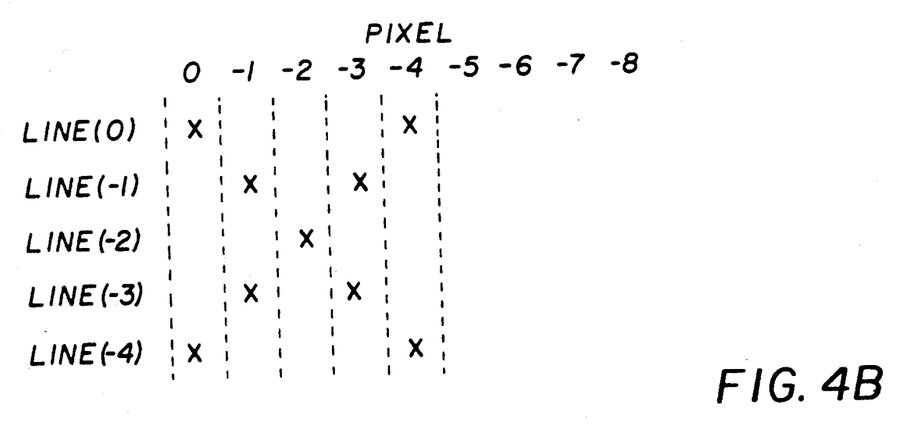

When configured for a two-dimensional 5×5 "X" type matrix as shown in FIG. 4B, the input selectors 16, 40, 16', 44 are set to select an external data stream through the inputs $B_{IN}$, $C_{IN}$, $D_{IN}$, and $E_{IN}$, respectively. The five line configuration shown in FIG. 4B is provided by the delays 80, 82, 84, and 86 providing respective line delays of four lines, one line, three lines, and two lines in the inputs $B_{IN}$, $C_{IN}$, $D_{IN}$, and $E_{IN}$. The analysis and explanation of the block diagram of FIG. 2 for the two-dimensional case is generally the same as that of the one-dimensional case except that the outputs from the adders 18, 28, 18', 28', and 50 are on five different lines. More specifically, in the unit processor 1 the delays 14 and 26 are set to four pixels and the channel selectors 12 and 24 are set for straight-through operation. With the data input through the delay 80 delayed by four lines, the output of the adder 18 represents the sum of pixels (0) and (−4) in line 0, while the output of the adder 28 represents the sum of pixels (0) and (−4) in line (−4). Likewise, with the delays 14' and 26' set to two pixels, the channel selectors 12' and 24' set for straight-through operation, and the inputs to selectors 40 and 16' delayed by one line and three lines, respectively, the output of the adder 18' represents the sum of pixels (−1) and (−3) in line (−1), while the output of the adder 28' represents the sum of pixels (−1) and (−3) in line (−3) (it is also necessary to specially drive the latches 10' and 22' on a line 88 to provide two pixel clocks of delay). The center pixel (−2) in line (−2) is generated by providing two lines of delay to the data input to selector 44 and two pixels of delay in the delay 46. Each of the scalers 20, 30, 20', 30', 52, 60, 62 would be programmed as hereinbefore described to set the requisite filter coefficients. Due to the symmetrical nature of the circuit configuration, the coefficients for each pixel on a given line will be the same.

Figure 4C:
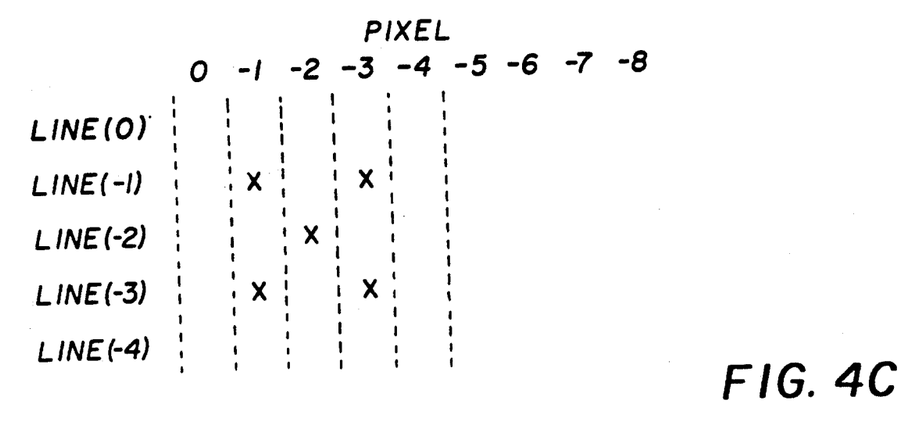

The configuration of FIG. 2 can also be used to implement the smaller "X" type filter function shown in FIG. 4C by setting the scalers 20, 30, and 60 to zero, in effect thereby eliminating lines 0 and −4 in FIG. 4B. Moreover, a purely vertical average of up to five pixels may be obtained by setting all delays 14, 26, 14', 26' and 46 to zero delay and then using the scalers 60, 62 and 52 to average the signals.

While the preferred embodiment shows scaling by bit-shifting (as in the scaler 20, FIG. 1) after addition (adder 18, FIG. 1), primarily because the same numerical coefficient is being applied to two symmetrical pixel positions, it would be equally feasible to do the scaling before doing the addition. In the latter case, separate scalers would be provided for each input to the adder and each pixel in the function could receive its own individual weighting.

The invention has been described in detail with particular reference to a presently preferred embodiment, but it will be understood that variations and modifications can be effected within the spirit and scope of the invention. For instance, the external line delays 80, 82, 84, and 86 shown in FIG. 2 may be incorporated into the ASIC architecture. Furthermore, microprocessor control of the mode lines a, b, c, and d (through the decoder 42) will enable a software configurable processing unit to be realized.

What is claimed is:

1. A digital processor for implementing an arithmetic process upon a clocked series of digital signals, said process representative of either a one-dimensional or two-dimensional function, said processor comprising:
   a first processor section, including first input means providing at least a one-clock delay to a first series of digital signals, a first adder having two inputs and an output, means for applying the signals from said first input means to each input of said first adder and for delaying at least one of the signals input to said first adder by at least a one-clock delay, first arithmetic means for applying an arithmetic operation to the signals processed by said first adder;
   a second processor section, including second input means providing at least a one-clock delay to a second series of digital signals, a second adder having two inputs and an output, means for applying the signals from said second input means to each input of said second adder and for delaying at least one of the signals input to said second adder by at least a one-clock delay, second arithmetic means for applying an arithmetic operation to the signals processed by said second adder;
   means for selecting the second series of signals input to said second input means either from the output of said first input means, to thereby represent a one-dimensional processing function, or from a further series of digital signals sufficiently delayed with respect to the first series of digital signals to represent a second dimension of a two dimensional processing function; and
   means for adding the output of said first and second adders to form an output of either a one- or two-dimensional processing function dependent upon the input selection made by said selecting means.

2. A digital processor as claimed in claim 1 wherein said first arithmetic means comprises respective scalers for applying the arithmetic operation to the signals input to said first adder.

3. A digital processor is claimed in claim 1 wherein said first arithmetic means applies the arithmetic operation to the output of said first adder.

4. A digital processor as claimed in claim 1 wherein said second arithmetic means comprises respective scalers for applying the arithmetic operation to the signals input to said second adder.

5. A digital processor as claimed in claim 1 wherein said second arithmetic means applies the arithmetic operation to the output of said second adder.

6. A digital processor as claimed in claim 1 wherein the arithmetic operations applied by said first and second arithmetic means are obtained by shifting the bit order of the respective digital signals.

7. A digital processor as claimed in claim 6 wherein means are applied to said first and second arithmetic means for selecting the number of bits to be shifted.

8. A digital processor as claimed in claim 1 wherein said means for applying and delaying the respective signals to said first and second adders includes channel selecting means for controlling at least one of the inputs to said adders.

9. A digital processor as claimed in claim 8 wherein one input to said first and second adders is delayed by said respective applying and delaying means, and the other input to said adders is selectively set to zero or obtained from the respective input means without change by appropriate switching of said channel selecting means.

10. A digital processor as claimed in claim 1 wherein said first and second input means are digital latches for setting the timing of the input signals.

11. A digital processor as claimed in claim 1 wherein means are applied to said applying and delaying means for selecting the number of clocks of delay provided by said applying and delaying means in the respective first and second processor sections.

12. A shift and add digital signal processor for implementing a filter function upon digitized image pixel signals arrayed in either one or two dimensions, said processor comprising:
   a first shift and add processor section including first latching means having an output providing a delay of at least one pixel to said pixel signals, a first adder having two inputs and an output, first signal means for applying the output of said first latching means through two channels having variable pixel delay therebetween to the two inputs of said first adder, first arithmetic means for performing an arithmetic operation on the output of said first adder by shifting the output of said first adder by a selected number of bits;
   a second shift and add processor section including second latching means having an output providing a delay of at least one pixel to said pixel signals, a second adder having two inputs and an output, second signal means for applying the output of said second latching means through two channels having variable delay therebetween to the two inputs of said second adder, second arithmetic means for performing an arithmetic operation on the output of said second adder by shifting the output of said second adder by a selected number of bits;
   means for selecting an input signal for said second latching means either from the output of said first latching means or from image pixel signals delayed by at least one line with respect to the image pixel signals input to said first latching means; and
   means for adding the output of said first and second adders to form either a one-dimensional or two-dimensional processing function dependent upon the input signal selected by said selecting means.

13. A shift and add digital processor as claimed in claim 12 wherein said first and second adjustable delays for delaying one input to the respective first and second adders by at least one pixel.

14. A shift and add digital processor as claimed in claim 13 further includes decoder means for selecting the number of bits shifted by said first and second arithmetic means and for setting the number of pixels of delay provided by said first and second adjustable delays.

15. A large matrix digital processor for implementing an arithmetic process upon a clocked series of digital signals, said process representative of either a one-dimensional or two-dimensional function, said large matrix processor comprising a cascaded series of unit processors, each unit processor comprising:
- (a) a first processor section, including first input means providing at least a one-clock delay to a first series of digital signals, a first adder having two inputs and an output, means for applying the signals from said first input means to each input of said first adder and for delaying at least one of the signals input to said first adder by at least a one-clock delay, first arithmetic means for applying an arithmetic operation to the signals processed by said first adder;
- (b) a second processor section, including second input means providing at least a one-clock delay to a second series of digital signals, a second adder having two inputs and an output, means for applying the signals from said second input means to each input of said second adder and for delaying at least one of the signals input to said second adder by at least a one-clock delay, second arithmetic means for applying an arithmetic operation to the signals processed by said second adder;
- (c) means for selecting the second series of signals input to said second input means either from the output of said first input means, to thereby represent a one-dimensional processing function, or from a further series of digital signals sufficiently delayed with respect to the first series of digital signals to represent a second dimension of a two dimensional processing function; and
- (d) means for adding the output of said first and second adders to form an output of either a one- or two-dimensional processing function dependent upon the input selection made by said selecting means; and said large matrix digital processor comprising further input selecting means for selecting a series of digital signals input to the first input means of each subsequent processor in the cascaded series of unit processors either from the signals output from the second input means of the preceding processor in the cascaded series of unit processors or from a further series of digital signals sufficiently delayed to represent the second dimension of a two-dimensional processing function.

16. A large matrix shift and add digital signal processor for implementing a filter function upon digitized image pixel signals arrayed in either one or two dimensions, said processor comprising a cascaded series of unit processors, each unit processor comprising: (p1 (a) a first shift and add processor section including first latching means having an output providing a delay of at least one pixel to said pixel signals, a first adder having two inputs and an output, first signal means for applying the output of said first latching means through two channels having variable pixel delay therebetween to the two inputs of said first adder, first arithmetic means for performing an arithmetic operation on the output of said first adder by shifting the output of said first adder by a selected number of bits;
- (b) a second shift and add processor section including second latching means having an output providing a delay of at least one pixel to said pixel signals, a second adder having two inputs and an output, second signal means for applying the output of said second latching means through two channels having variable delay therebetween to the two inputs of said second adder, second arithmetic means for performing an arithmetic operation on the output of said second adder by shifting the output of said second adder by a selected number of bits;
- (c) means for selecting an input signal for said second latching means either from the output of said first latching means or from image pixel signals delayed by at least one line with respect to the image pixel signals input to said first latching means; and
- (d) means for adding the output of said first and second adders to form either a one-dimensional or two-dimensional processing function dependent upon the input signal selected by said selecting means; and said large matrix shift and add digital signal processor comprising further input selecting means for selecting the input pixel signals to the first latching means of each subsequent processor in the cascaded series of unit processors either from the output of the second latching means of the preceding digital processor in the cascaded series of unit processors or from image pixel signals delayed by a selected number of lines with respect to the image pixel signals input to said first latching means of the preceeding processor.

* * * * *